(12) United States Patent
Tan et al.

(10) Patent No.: US 12,398,000 B2
(45) Date of Patent: Aug. 26, 2025

(54) SUBSTRATE CONVEYING ROBOT SYSTEM

(71) Applicant: KAWASAKI JUKOGYO KABUSHIKI KAISHA, Kobe (JP)

(72) Inventors: Haruhiko Tan, Kobe (JP); Masaya Yoshida, Himeji (JP); Masahiko Sumitomo, Kakogawa (JP); Shota Tominaga, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 182 days.

(21) Appl. No.: 18/024,640

(22) PCT Filed: Nov. 2, 2020

(86) PCT No.: PCT/JP2020/041024
§ 371 (c)(1),
(2) Date: Mar. 3, 2023

(87) PCT Pub. No.: WO2022/049782
PCT Pub. Date: Mar. 10, 2022

(65) Prior Publication Data
US 2024/0025671 A1   Jan. 25, 2024

(30) Foreign Application Priority Data
Sep. 3, 2020   (JP) ................. 2020-148488

(51) Int. Cl.
| | | |
|---|---|---|
| *H01L 21/687* | (2006.01) | |
| *B25J 9/04* | (2006.01) | |
| *B25J 15/00* | (2006.01) | |
| *B25J 19/02* | (2006.01) | |
| *B65G 47/90* | (2006.01) | |
| *H01L 21/67* | (2006.01) | |

(52) U.S. Cl.
CPC ............ *B65G 47/905* (2013.01); *B25J 9/042* (2013.01); *B25J 15/0014* (2013.01); *B25J 19/02* (2013.01); *H01L 21/67259* (2013.01); *H01L 21/68707* (2013.01)

(58) Field of Classification Search
CPC ..... B25J 9/042; B25J 9/043; H01L 21/68707; H01L 21/6838; H01L 21/67766; H01L 21/67742
See application file for complete search history.

(56) References Cited

U.S. PATENT DOCUMENTS

| | | | |
|---|---|---|---|
| 2015/0127147 A1 | 5/2015 | Yamazaki et al. | |
| 2016/0344266 A1 | 11/2016 | Ogawa et al. | |
| 2017/0165838 A1 | 6/2017 | Sato | |
| 2017/0246741 A1* | 8/2017 | Kobayashi | ............... B25J 9/126 |

(Continued)

FOREIGN PATENT DOCUMENTS

| | | | | |
|---|---|---|---|---|
| JP | 2007203402 A | * | 8/2007 | |
| JP | 4466785 B2 | * | 5/2010 | .............. B25J 9/042 |

(Continued)

*Primary Examiner* — Gerald McClain
(74) *Attorney, Agent, or Firm* — Oliff PLC

(57) ABSTRACT

A substrate conveying robot includes a hand sensor provided on a substrate holding hand, and a hand circuit substrate provided on the substrate holding hand and connected to the hand sensor, and a serial communication connection is made between a robot controller and the hand circuit substrate through an inside of an arm.

13 Claims, 4 Drawing Sheets

(56) References Cited

U.S. PATENT DOCUMENTS

2020/0068739 A1    2/2020   Tagashira
2020/0238535 A1    7/2020   Tokushima et al.

FOREIGN PATENT DOCUMENTS

| JP | 2012152843 A | * | 8/2012 |
| JP | 2013-69914 A | | 4/2013 |
| JP | 2015-89583 A | | 5/2015 |
| JP | 2015089583 A | * | 5/2015 |
| JP | 2017-104930 A | | 6/2017 |
| JP | 6165286 B1 | | 7/2017 |
| JP | 6299670 B2 | | 3/2018 |
| JP | 2018-089764 A | | 6/2018 |
| JP | 6365736 B2 | | 8/2018 |
| JP | 2018-142100 A | | 9/2018 |
| JP | 2020-121362 A | | 8/2020 |
| WO | 2019/014146 A1 | | 1/2019 |

* cited by examiner

SUBSTRATE CONVEYING ROBOT SYSTEM

TECHNICAL FIELD

The present invention relates to a substrate conveying robot system, and more particularly, it relates to a substrate conveying robot system including a hand sensor provided on a substrate holding hand.

BACKGROUND ART

Conventionally, a substrate conveying robot including a substrate conveying hand is known. Such a substrate conveying robot is disclosed in Japanese Patent Laid-Open No. 2013-069914, for example.

Japanese Patent Laid-Open No. 2013-069914 discloses a substrate conveying robot that is a horizontal articulated robot. This substrate conveying robot includes a base, an arm connected to the base and rotating in a horizontal plane, and substrate conveying hands connected to the arm and rotating in the horizontal plane. A controller is connected to the substrate conveying robot. The controller controls the operation of starting and stopping the substrate conveying robot. Thus, substrates are conveyed by the substrate conveying robot.

Although not clearly described in Japanese Patent Laid-Open No. 2013-069914, in a conventional substrate conveying robot as described in Japanese Patent Laid-Open No. 2013-069914, sensors may be provided on substrate conveying hands to detect substrates held by the substrate conveying hands. In this case, signals are transmitted from the sensors to a controller by wiring through the inside of an arm.

PRIOR ART

Patent Document

Patent Document 1: Japanese Patent Laid-Open No. 2013-069914

SUMMARY OF THE INVENTION

Problems to be Solved by the Invention

In the aforementioned substrate conveying robot including the sensors, when each of the sensors communicates with the robot controller through the inside of the arm, a number of lines of wiring corresponding to the number of sensors are inserted from the substrate holding hands toward the controller through the inside of the arm. Therefore, the wiring becomes complex, and the inside of the arm needs to be relatively large. Thus, the size of the substrate conveying robot is disadvantageously increased.

The present invention is intended to solve the above problems. The present invention aims to provide a substrate conveying robot system capable of reducing or preventing the complexity of wiring and an increase in the size of an arm (an increase in the size of a substrate conveying robot).

Means for Solving the Problems

In order to attain the aforementioned object, a substrate conveying robot system according to an aspect of the present invention includes a substrate conveying robot, and a robot controller configured or programmed to control the substrate conveying robot. The substrate conveying robot includes an arm, a substrate holding hand moved by the arm, rotatably connected to the arm, and including a blade that supports a substrate, a hand sensor provided on the substrate holding hand, and a hand circuit substrate provided on the substrate holding hand and connected to the hand sensor. A serial communication connection is made between the robot controller and the hand circuit substrate through an inside of the arm.

In the substrate conveying robot system according to this aspect of the present invention, as described above, a serial communication connection is made between the robot controller and the hand circuit substrate connected to the hand sensor through the inside of the arm. Accordingly, the hand sensor and the robot controller can communicate with each other by a relatively small number of lines of wiring for the serial communication connection between the robot controller and the hand circuit substrate. Even when a plurality of hand sensors are provided, the plurality of hand sensors are connected to the hand circuit substrate by a plurality of lines of wiring while the robot controller and the hand circuit substrate communicate with each other by a relatively small number of lines of the wiring. Consequently, the complexity of the wiring and an increase in the size of the arm (an increase in the size of the substrate conveying robot) can be reduced or prevented due to a small number of lines of the wiring.

Furthermore, the length of the wiring between the hand sensor and the hand circuit substrate is relatively short, and thus an increase in the influence of noise from the outside due to an increase in the length of the wiring can be reduced or prevented.

Effect of the Invention

According to the present invention, as described above, it is possible to reduce or prevent the complexity of the wiring and an increase in the size of the arm (an increase in the size of the substrate conveying robot).

MODES FOR CARRYING OUT THE INVENTION

An embodiment embodying the present invention is hereinafter described on the basis of the drawings.

The configuration of a substrate conveying robot system 100 according to this embodiment is now described with reference to FIGS. 1 and 2.

Figure 1:
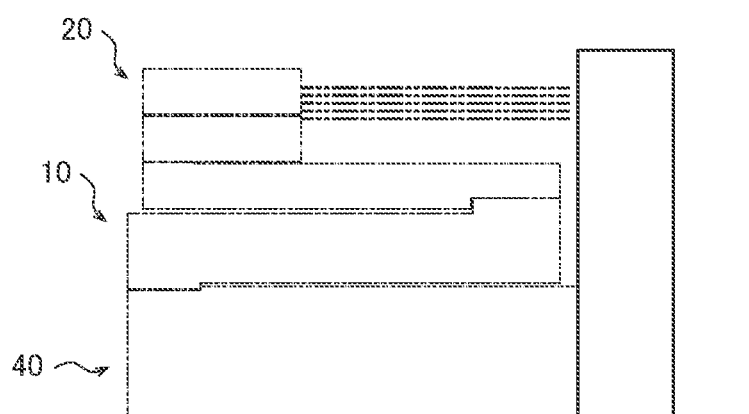
FIG. 1 is a diagram showing the configuration of a substrate conveying robot according to an embodiment of the present invention.
Figure 1:
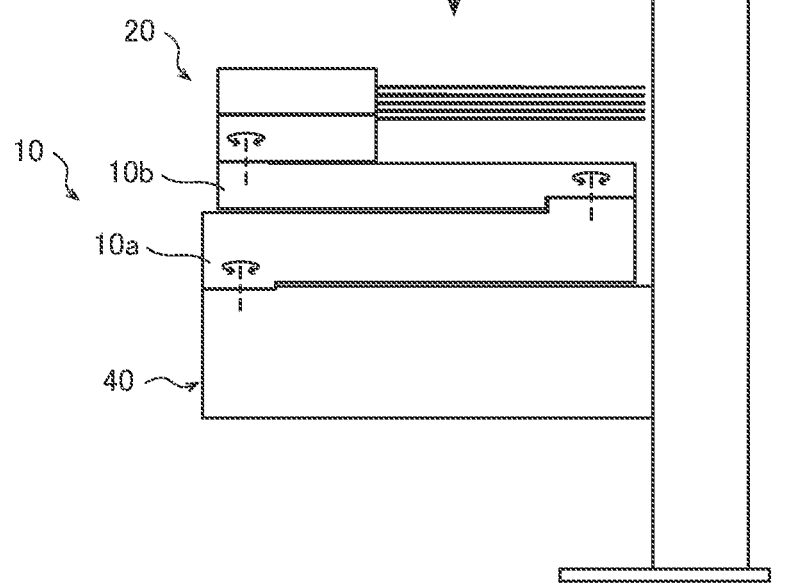
Figure 2:
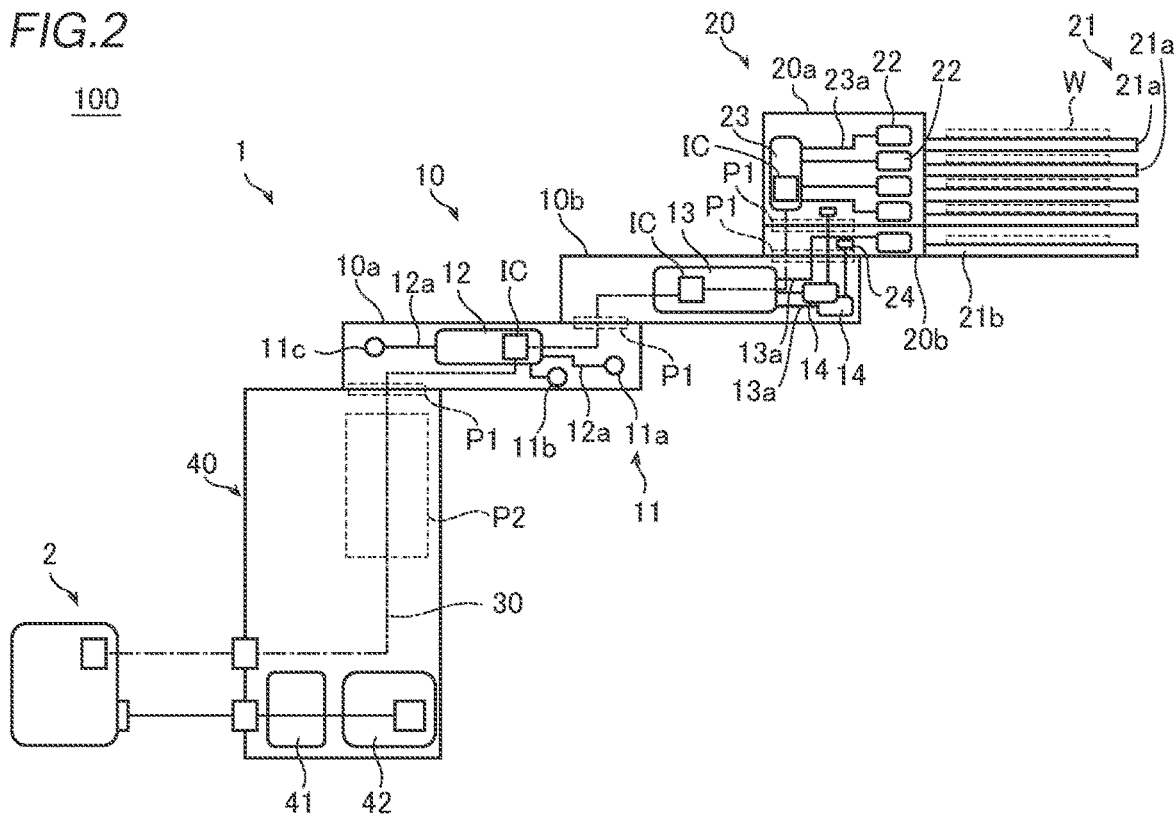
FIG. 2 is a schematic view of a substrate conveying robot system according to the embodiment of the present invention.

As shown in FIGS. 1 and 2, the substrate conveying robot system 100 according to this embodiment includes a substrate conveying robot 1 and a robot controller 2 (see FIG. 2) that controls the substrate conveying robot 1. In the substrate conveying robot 1, an arm 10 is moved up and down with respect to a substantially columnar housing 50 by an arm elevating mechanism (not shown) that moves the arm 10 up and down.

The substrate conveying robot 1 is a horizontal articulated robot. Specifically, the substrate conveying robot 1 includes the arm 10, a substrate holding hand 20 moved by the arm 10, rotatably connected to the arm 10, and including blades 21 that support substrates (semiconductor wafers) W, substrate detection sensors 22 provided on the substrate holding hand 20, and a digital input circuit substrate 23 provided on the substrate holding hand 20 and connected to the substrate detection sensors 22. The substrate detection sensors 22 are connected to the digital input circuit substrate 23 by wiring 23a. The substrate holding hand 20 includes an upper substrate holding hand 20a and a lower substrate holding hand 20b arranged below the upper substrate holding hand 20a and operating independently of the upper substrate holding hand 20a. The wiring 23a is separate from wiring 30 described below.

In this embodiment, a plurality of blades 21 are provided, and a plurality of substrate detection sensors 22 are provided so as to correspond to the plurality of blades 21. Each of the plurality of substrate detection sensors 22 is connected to the digital input circuit substrate 23 by the wiring 23a. The plurality of blades 21 are spaced apart from each other along a vertical direction. The plurality of blades 21 include a plurality of blades 21a attached to the upper substrate holding hand and a blade 21b attached to the lower substrate holding hand 20b.

In this embodiment, a serial communication connection (see the wiring 30 in FIG. 2) is made between the robot controller 2 and the digital input circuit substrate 23 through the inside of the arm 10. The digital input circuit substrate 23 is an example of a "hand circuit substrate" in the claims.

In this embodiment, the substrate conveying robot system 100 includes an analog sensor 11 provided on the arm 10, an analog input circuit substrate 12 provided on the arm 10 and connected to the analog sensor 11, and a digital input/output circuit substrate 13 connected to the substrate detection sensors 22. A serial communication connection is made between the robot controller 2, the analog input circuit substrate 12, the digital input/output circuit substrate 13, and the digital input circuit substrate 23 through the inside of the arm 10 by daisy chain connection. The analog sensor 11 and the substrate detection sensors 22 are examples of an "arm sensor" and a "hand sensor" in the claims, respectively. The analog input circuit substrate 12 is an example of an "arm circuit substrate" or a "first arm circuit substrate" in the claims. The digital input/output circuit substrate 13 is an example of an "arm circuit substrate" or a "second arm circuit substrate" in the claims.

In this embodiment, a serial communication connection is made between the robot controller 2, the analog input circuit substrate 12, and the digital input circuit substrate 23 through the inside of the arm 10 and movable portions P1 at which the substrate holding hand 20 and the arm 10 are relatively movable by daisy chain connection. Inside a base 40 on which the arm 10 is relatively movably arranged, a movable portion P2 is provided at which the wiring 30 for serial communication connection is movable. Tubular members (not shown) are provided in the movable portions P1, and the wiring 30 passes through the insides of the tubular members.

In this embodiment, the arm 10 includes a first arm 10a that is rotatable with a first end as the center of rotation, and a second arm 10b including a first end rotatably connected to a second end of the first arm 10a, rotatable with respect to the first arm 10a, and connected to the substrate holding hand 20. The analog input circuit substrate 12 and the digital input circuit substrate 23 are provided on at least one of the first arm 10a or the second arm 10b.

As shown in FIG. 2, both the first arm 10a and the second arm 10b rotate along the horizontal plane. A space is provided inside the first arm 10a and the second arm and the wiring 30 passes through the inside of the space.

In this embodiment, the analog input circuit substrate 12 is provided on the first arm 10a, and the digital input circuit substrate 23 is provided on the second arm 10b. The analog input circuit substrate 12 is arranged in the space inside the first arm 10a, and the digital input circuit substrate 23 is arranged in the space inside the second arm 10b.

In this embodiment, a signal is input from the analog sensor 11 to the analog input circuit substrate 12. The analog sensor 11 is connected to the analog input circuit substrate 12 by wiring 12a. The wiring 12a is separate from the wiring 30a.

In this embodiment, the analog sensor 11 detects other than rotation of a motor provided at a joint of the arm 10. Specifically, the analog sensor 11 includes at least one of a temperature sensor 11a, an acceleration sensor 11b, or a pressure sensor 11c. In this embodiment, all of the temperature sensor 11a, the acceleration sensor 11b, and the pressure sensor 11c are provided.

In this embodiment, the digital input/output circuit substrate 13 is connected to one of the substrate detection sensors 22 and transmits and receives a signal to and from the substrate detection sensor 22. The digital input/output circuit substrate 13 is connected to the substrate detection sensor 22 by wiring 13a. The wiring 13a is separate from the wiring 30.

In this embodiment, the substrate conveying robot system 100 further includes electromagnetic valves 14 provided on the second arm 10b to transmit and receive signals to and from the digital input/output circuit substrate 13 and adjusting air sent to cylinders 24 provided on the substrate holding hand 20. The electromagnetic valves 14 are used to control opening and closing of pipes through which a fluid (such as air) passes. The digital input/output circuit substrate 13 is connected to the electromagnetic valves 14 by wiring 13a.

In this embodiment, the substrate detection sensors 22 detect other than rotation of the motor. Specifically, the substrate detection sensors 22 detect the presence of the substrates W supported by the blades 21. The digital input circuit substrate 23 receives signals from the substrate detection sensors 22. The substrate detection sensors 22 are any one of reflective optical sensors, transmissive optical sensors, capacitance sensors, distance sensors, and touch sensors designed on the assumption that they contact the substrates W. In this embodiment, the substrate detection sensors 22 are reflective optical sensors.

In this embodiment, a serial communication connection is made between the robot controller 2 and the digital input circuit substrate 23 by a communication network that allows mutual information sharing between the robot controller 2 and the digital input circuit substrate 23. Specifically, the robot controller 2 and the analog input circuit substrate 12 are connected to each other by the wiring 30 for serial communication connection. The analog input circuit substrate 12 and the digital input/output circuit substrate 13 are connected to each other by the wiring 30 for serial communication connection. The digital input/output circuit substrate 13 and the digital input circuit substrate 23 are connected to each other by the wiring 30 for serial communication connection. ICs are provided to establish a communication network that allows mutual information sharing on the analog input circuit substrate 12, the digital input/output circuit substrate 13, and the digital input circuit substrate 23.

Inside the base 40, a power supply substrate 41 of an encoder (not shown) and an ID (identification) substrate 42 are provided.

Figure 3:
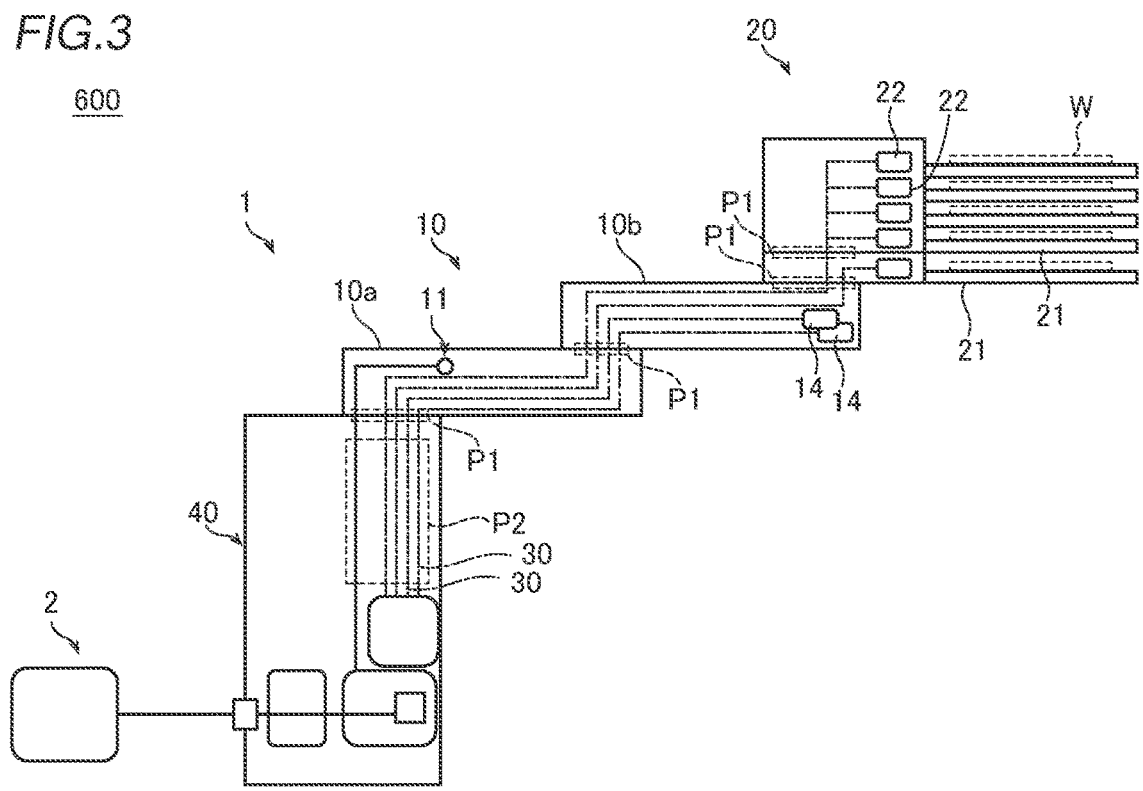
FIG. 3 is a schematic view of a substrate conveying robot system according to a comparative example.

A substrate conveying robot system 600 according to a comparative example in FIG. 3 is now described.

When a plurality of substrate detection sensors 22 and other sensors (such as an analog sensor 11 and electromagnetic valves 14) communicate with a robot controller 2 through the inside of an arm 10 as in the substrate conveying robot system 600 according to the comparative example in FIG. 3, a number of lines of wiring corresponding to the number of substrate detection sensors 22 and other sensors are inserted to the robot controller 2 side through the inside of the arm 10. Therefore, it is necessary to relatively enlarge the inside of the arm 10, and thus the size of a substrate conveying robot 1 is increased. In FIG. 3, the lines of the wiring 30 extending from the plurality of substrate detection sensors 22 are grouped together in a substrate holding hand 20, but in reality, a plurality of lines of the wiring 30 extending from the plurality of substrate detection sensors 22 are connected to the robot controller 2 through the inside of the arm 10.

Advantages of This Embodiment

According to this embodiment, the following advantages are achieved.

According to this embodiment, as described above, a serial communication connection is made between the robot controller 2 and the digital input circuit substrate 23 connected to the substrate detection sensors 22 through the inside of the arm 10 such that the substrate detection sensors 22 and the robot controller 2 can communicate with each other by a relatively small number of lines of the wiring 30 for the serial communication connection between the robot controller 2 and the digital input circuit substrate 23. Even when a plurality of substrate detection sensors 22 are provided, the plurality of substrate detection sensors 22 are connected to the digital input circuit substrate 23 by a plurality of lines of the wiring 30 while the robot controller 2 and the digital input circuit substrate 23 communicate with each other by a relatively small number of lines of the wiring 30. Consequently, the complexity of the wiring 30 and an increase in the size of the arm 10 (an increase in the size of the substrate conveying robot 1) can be reduced or prevented due to a small number of lines of the wiring 30.

Furthermore, the length of the wiring 30 between the substrate detection sensors 22 and the digital input circuit substrate 23 is relatively short, and thus an increase in the influence of noise from the outside due to an increase in the length of the wiring 30 can be reduced or prevented.

According to this embodiment, as described above, the substrate conveying robot system 100 includes the analog sensor 11 provided on the arm 10, the analog input circuit substrate 12 provided on the arm 10 and connected to the analog sensor 11, and the digital input/output circuit substrate 13 connected to the substrate detection sensors 22. A serial communication connection is made between the robot controller 2, the analog input circuit substrate 12, the digital input/output circuit substrate 13, and the digital input circuit substrate 23 through the inside of the arm 10 by daisy chain connection. Accordingly, unlike a case in which the substrate detection sensors 22 and the analog sensor 11 are connected to the robot controller 2 by the wiring 30, the substrate detection sensors 22 and the analog sensor 11 can communicate with the robot controller 2 by a relatively small number of lines of the wiring 30 for the serial communication connection between the robot controller 2, the analog input circuit substrate 12, the digital input/output circuit substrate 13, and the digital input circuit substrate 23. Consequently, in the configuration in which the analog input circuit substrate 12 and the digital input/output circuit substrate 13 are provided, the complexity of the wiring 30 and an increase in the size of the arm 10 (an increase in the size of the substrate conveying robot 1) can be reduced or prevented.

According to this embodiment, as described above, a serial communication connection is made between the robot controller 2, the analog input circuit substrate 12, the digital input/output circuit substrate 13, and the digital input circuit substrate 23 through the inside of the arm and the movable portions P1 at which the substrate holding hand 20 and the arm 10 are relatively movable by daisy chain connection. Accordingly, the robot controller 2, the analog input circuit substrate 12, the digital input/output circuit substrate 13, and the digital input circuit substrate 23 are connected in series by daisy chain connection, and thus the number of lines of the wiring 30 through the movable portions P1 is relatively small. Consequently, unlike a case in which a relatively large number of lines of the wiring 30 pass through the movable portions P1, the movable portions P1 can be easily moved.

According to this embodiment, as described above, the arm 10 includes the first arm 10a rotatable with the first end as the center of rotation, and the second arm 10b including the first end rotatably connected to the second end of the first arm 10a, rotatable with respect to the first arm 10a, and connected to the substrate holding hand and the analog input circuit substrate 12 and the digital input/output circuit substrate 13 are provided on at least one of the first arm 10a or the second arm 10b. Accordingly, in the substrate conveying robot system 100 including the analog input circuit substrate 12 and the digital input/output circuit substrate 13 on at least one of the first arm 10a or the second arm 10b, the complexity of the wiring 30 and an increase in the size of the arm 10 (an increase in the size of the substrate conveying robot 1) can be reduced or prevented.

According to this embodiment, as described above, the analog input circuit substrate 12 is provided on the first arm 10a, and the digital input/output circuit substrate 13 is provided on the second arm 10b. Accordingly, in the substrate conveying robot system 100 including both the analog input circuit substrate 12 and the digital input/output circuit substrate 13, the complexity of the wiring 30 and an increase in the size of the arm 10 (an increase in the size of the substrate conveying robot 1) can be reduced or prevented.

According to this embodiment, as described above, the substrate conveying robot system 100 includes the analog input circuit substrate 12 to which a signal is input from the analog sensor 11. Accordingly, unlike a case in which substrate detection sensors 22 and the analog sensor 11 are connected to the robot controller 2 by the wiring the substrate detection sensors 22 and the analog sensor 11 can communicate with the robot controller 2 while the complexity of the wiring 30 is reduced or prevented.

According to this embodiment, as described above, the analog sensor 11 detects other than rotation of the motor provided at the joint of the arm 10. Accordingly, even when the analog sensor 11 is provided separately from a sensor that detects rotation of the motor, a serial communication connection is made between the analog sensor 11 and the robot controller 2 through the analog input circuit substrate 12, and thus the complexity of the wiring 30 and an increase in the size of the arm 10 (an increase in the size of the substrate conveying robot 1) can be reduced or prevented.

According to this embodiment, as described above, the analog sensor 11 includes at least one of the temperature sensor 11a, the acceleration sensor 11b, or the pressure sensor 11c. Accordingly, even when at least one of the temperature sensor 11a, the acceleration sensor 11b, or the pressure sensor 11c is provided, a serial communication connection is made between at least one of the temperature sensor 11a, the acceleration sensor 11b, or the pressure sensor 11c and the robot controller 2 through the analog input circuit substrate 12, and thus the complexity of the wiring 30 and an increase in the size of the arm 10 (an increase in the size of the substrate conveying robot 1) can be reduced or prevented.

According to this embodiment, as described above, the digital input/output circuit substrate 13 connected to the substrate detection sensors 22 to transmit and receive signals to and from the substrate detection sensors 22 is provided. Accordingly, even when the substrate detection sensors 22 are provided, a serial communication connection is made between the substrate detection sensors 22 and the robot controller 2 through the digital input/output circuit substrate 13, and thus the complexity of the wiring 30 and an increase in the size of the arm 10 (an increase in the size of the substrate conveying robot 1) can be reduced or prevented.

According to this embodiment, as described above, the substrate conveying robot system 100 includes the electromagnetic valves 14 provided on the second arm 10b to transmit and receive signals to and from the digital input/output circuit substrate 13 and adjust the air sent to the cylinders 24 provided on the substrate holding hand 20. Accordingly, even when the electromagnetic valves 14 are provided on the second arm 10b, a serial communication connection is made between the electromagnetic valves 14 and the robot controller 2 through the digital input/output circuit substrate 13 of the second arm 10b, and thus the complexity of the wiring 30 and an increase in the size of the arm 10 (an increase in the size of the substrate conveying robot 1) can be reduced or prevented.

According to this embodiment, as described above, the substrate detection sensors 22 detect other than rotation of the motor. Accordingly, even when the substrate detection sensors 22 are provided separately from the sensor that detects rotation of the motor, a serial communication connection is made between the substrate detection sensors 22 and the robot controller 2 through the digital input circuit substrate 23, and thus the complexity of the wiring 30 and an increase in the size of the arm 10 (an increase in the size of the substrate conveying robot 1) can be reduced or prevented.

According to this embodiment, as described above, the substrate detection sensors 22 are provided to detect the presence of the substrates W supported by the blades 21, and the digital input circuit substrate 23 receives signals from the substrate detection sensors 22. Accordingly, even when the substrate detection sensors 22 are provided separately from the sensor that detects rotation of the motor, a serial communication connection is made between the substrate detection sensors 22 and the robot controller 2 through the digital input circuit substrate 23, and thus the complexity of the wiring 30 and an increase in the size of the arm 10 (an increase in the size of the substrate conveying robot 1) can be reduced or prevented.

According to this embodiment, as described above, a serial communication connection is made between the robot controller 2 and the digital input circuit substrate 23 by the communication network that allows mutual information sharing between the robot controller 2 and the digital input circuit substrate 23. Accordingly, mutual information is shared between the robot controller 2 and the digital input circuit substrate 23, and thus the substrate conveying robot system 100 can be easily controlled.

According to this embodiment, as described above, the plurality of blades 21 are provided, and the plurality of substrate detection sensors 22 are provided so as to correspond to the plurality of blades 21. When the plurality of substrate detection sensors 22 are provided, the number of lines of the wiring 30 extending from the substrate detection sensors 22 increases. Therefore, the plurality of lines of the wiring 30 extending from the plurality of substrate detection sensors 22 are connected to the digital input circuit substrate 23, and a serial communication connection is made between the digital input circuit substrate 23 and the robot controller 2 through the inside of the arm 10 such that even when the plurality of substrate detection sensors 22 are provided, the complexity of the wiring 30 and an increase in the size of the arm 10 (an increase in the size of the substrate conveying robot 1) can be reduced or prevented.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

Figure 4:
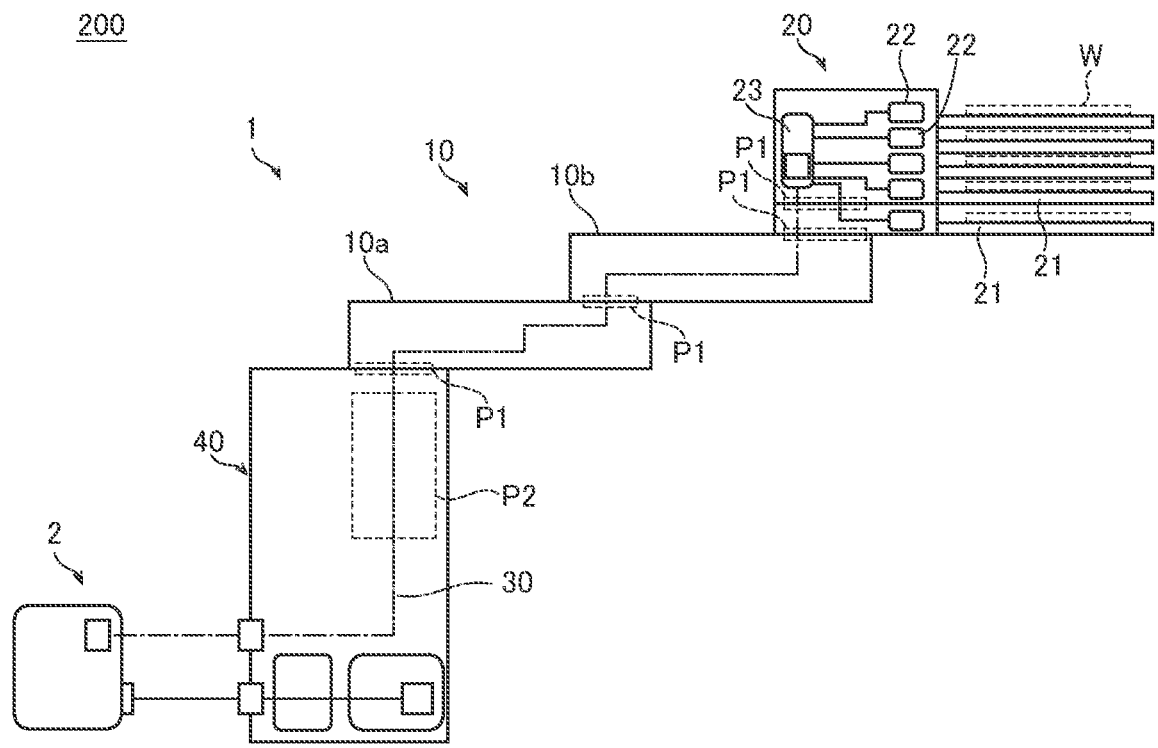
FIG. 4 is a schematic view of a substrate conveying robot system according to a first modified example of the present invention.

For example, while the example in which the analog input circuit substrate 12 is provided on the first arm and the digital input/output circuit substrate 13 is provided on the second arm 10b has been shown in the aforementioned embodiment, the present invention is not limited to this. For example, as in a substrate conveying robot system 200 according to a first modified example shown in FIG. 4, the analog input circuit substrate 12 and the digital input/output circuit substrate 13 may not be provided on the arm 10. In this case, a serial communication connection is made between the digital input circuit substrate 23 and the robot controller 2.

Figure 5:
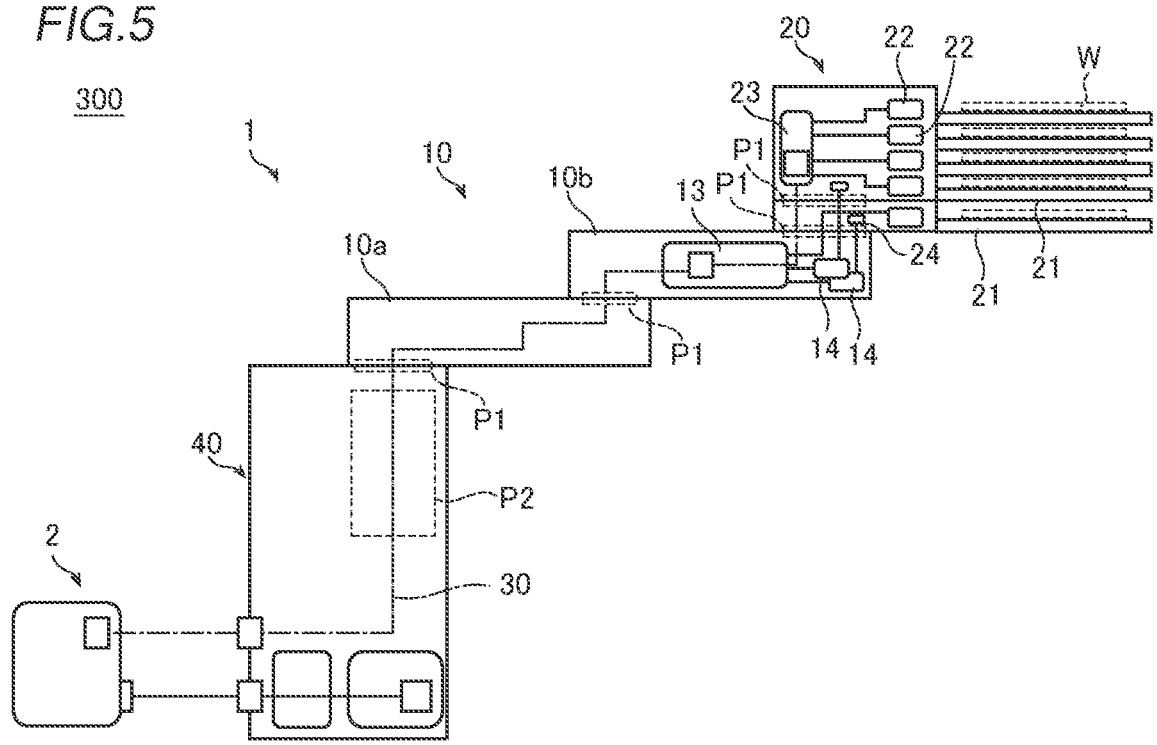
FIG. 5 is a schematic view of a substrate conveying robot system according to a second modified example of the present invention.

While the example in which the analog input circuit substrate 12 is provided on the first arm 10a, and the digital input/output circuit substrate 13 is provided on the second arm 10b has been shown in the aforementioned embodiment, the present invention is not limited to this. For example, as in a substrate conveying robot system 300 according to a second modified example shown in FIG. 5, whereas the digital input/output circuit substrate 13 may be provided on the arm 10, the analog input circuit substrate 12 may not be provided. In this case, a serial communication connection is made between the digital input circuit substrate 23, the digital input/output circuit substrate 13, and the robot controller 2.

Figure 6:
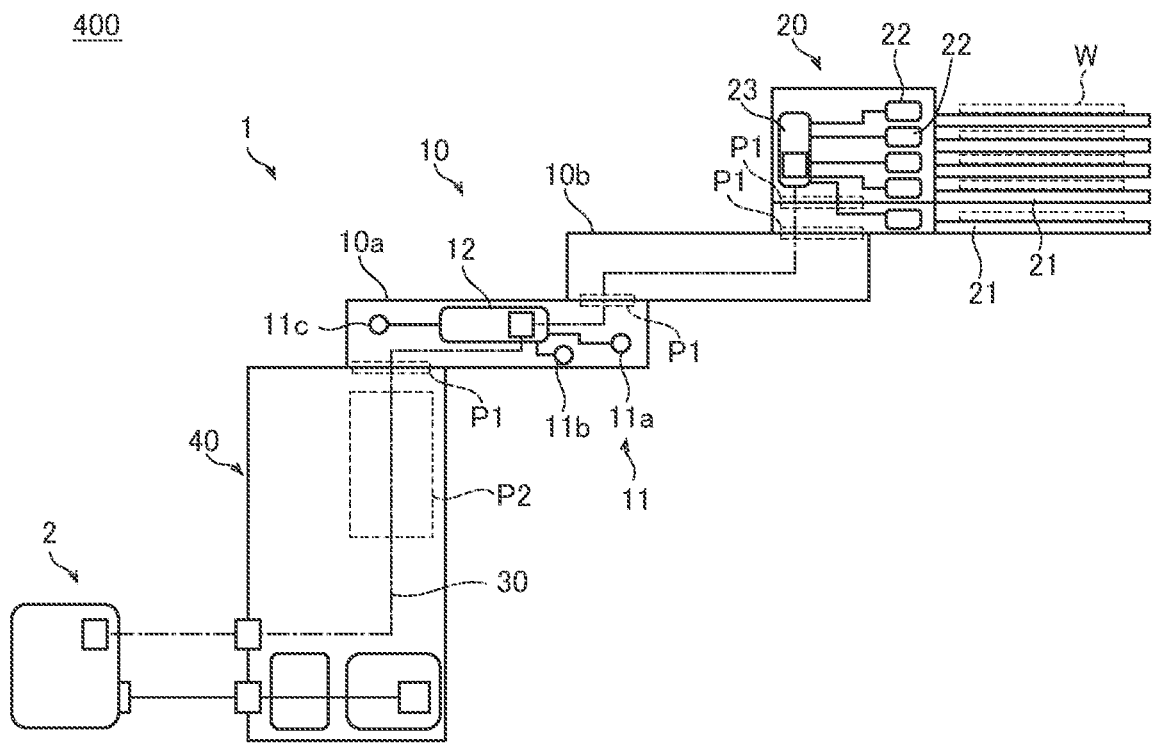
FIG. 6 is a schematic view of a substrate conveying robot system according to a third modified example of the present invention.

While the example in which the analog input circuit substrate 12 is provided on the first arm 10*a*, and the digital input/output circuit substrate 13 is provided on the second arm 10*b* has been shown in the aforementioned embodiment, the present invention is not limited to this. For example, as in a substrate conveying robot system 400 according to a third modified example shown in FIG. 6, whereas the analog input circuit substrate 12 may be provided on the arm 10, the digital input/output circuit substrate 13 may not be provided. In this case, a serial communication connection is made between the digital input circuit substrate 23, the analog input circuit substrate 12, and the robot controller 2.

Figure 7:
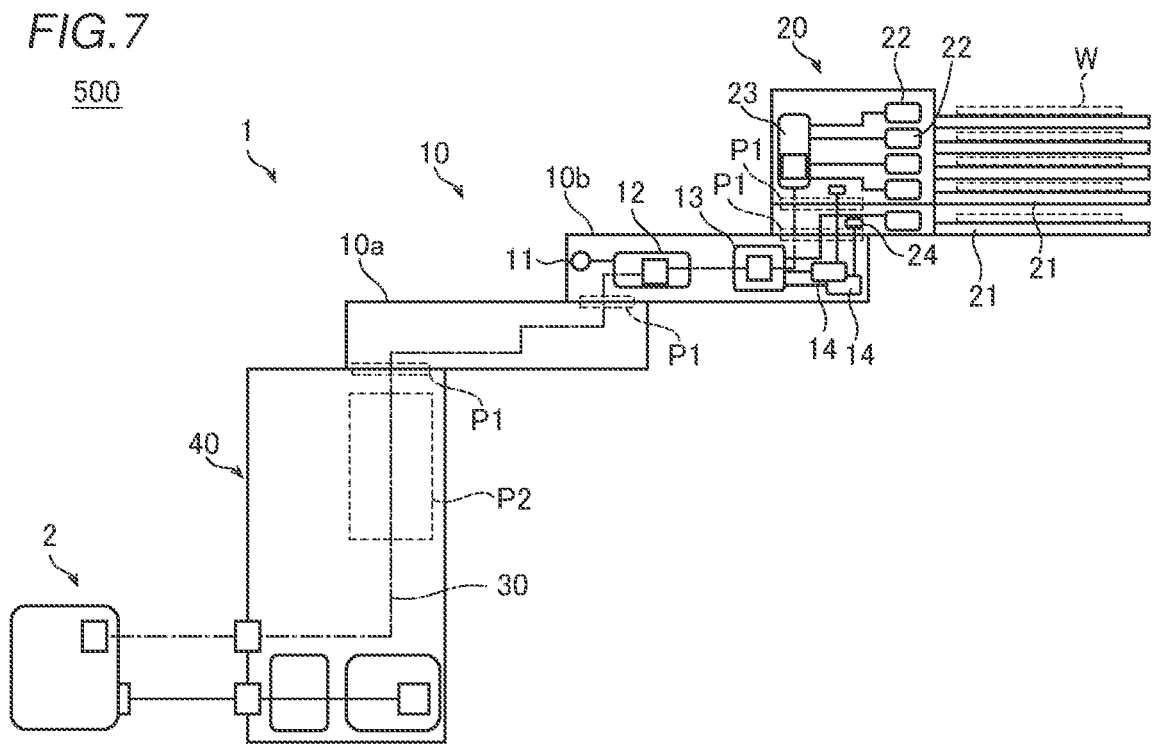
FIG. 7 is a schematic view of a substrate conveying robot system according to a fourth modified example of the present invention.

While the example in which the analog input circuit substrate 12 is provided on the first arm 10*a*, and the digital input/output circuit substrate 13 is provided on the second arm 10*b* has been shown in the aforementioned embodiment, the present invention is not limited to this. For example, as in a substrate conveying robot system 500 according to a fourth modified example shown in FIG. 7, both the analog input circuit substrate 12 and the digital input/output circuit substrate 13 may be provided on the second arm 10*b*. Alternatively, both the analog input circuit substrate 12 and the digital input/output circuit substrate 13 may be provided on the first arm 10*a*.

While the example in which the plurality of blades 21 and the plurality of substrate detection sensors 22 are provided has been shown in the aforementioned embodiment, the present invention is not limited to this. For example, the present invention may be applied to a substrate conveying robot system in which one blade 21 and one substrate detection sensor 22 are provided.

While the example in which the arm 10 includes two arm portions, which are the first arm 10*a* and the second arm 10*b*, has been shown in the aforementioned embodiment, the present invention is not limited to this. For example, the number of arm portions of the arm has may be other than two.

While the example in which the analog sensor 11 includes the temperature sensor 11*a*, the acceleration sensor 11*b*, and the pressure sensor 11*c* has been shown in the aforementioned embodiment, the present invention is not limited to this. In the present invention, the analog sensor 11 may include sensors other than these sensors.

While the example in which the "hand sensor" according to the present invention is the substrate detection sensor 22 has been shown in the aforementioned embodiment, the present invention is not limited to this. A sensor other than the substrate detection sensor 22 may be applied as the "hand sensor" according to the present invention.

DESCRIPTION OF REFERENCE NUMERALS

1: substrate conveying robot
2: robot controller
10: arm
10*a*: first arm
10*b*: second arm
11: analog sensor (arm sensor)
11*a*: temperature sensor
11*b*: acceleration sensor
11*c*: pressure sensor
12: analog input circuit substrate (arm circuit substrate, first arm circuit substrate)
13: digital input/output circuit substrate (arm circuit substrate, second arm circuit substrate)
14: electromagnetic valve
20: substrate holding hand
21: blade
22: substrate detection sensor (hand sensor)
23: digital input circuit substrate (hand circuit substrate)
24: cylinder
P1: movable portion
W: substrate

The invention claimed is:

1. A substrate conveying robot system comprising:
a substrate conveying robot; and
a robot controller configured or programmed to control the substrate conveying robot; wherein
the substrate conveying robot includes:
an arm;
a substrate holding hand configured to be moved by the arm, rotatably connected to the arm, and including a plurality of blades, each blade is configured to support a separate corresponding substrate;
a plurality of substrate detection sensors provided on the substrate holding hand, each of the substrate detection sensors corresponding to one of the plurality of blades and configured to detect a presence of the separate corresponding substrate on a corresponding blade; and
a hand circuit substrate provided on the substrate holding hand and connected in parallel to each of the plurality of substrate detection sensors; and
a serial communication connection is made between the robot controller and the hand circuit substrate through an inside of the arm, wherein
the hand circuit substrate combines signals from the plurality of substrate detection sensors connected in parallel into the serial communication connection.

2. The substrate conveying robot system according to claim 1, further comprising:
an arm sensor provided on the arm; and
an arm circuit substrate provided on the arm and connected to at least one of the arm sensor or the plurality of substrate detection sensors; wherein
the serial communication connection is made between the robot controller, the arm circuit substrate, and the hand circuit substrate through the inside of the arm by a daisy chain connection.

3. The substrate conveying robot system according to claim 2, wherein the serial communication connection is made between the robot controller, the arm circuit substrate, and the hand circuit substrate through the inside of the arm and through a rotatable joint with a passage for cabling at which the substrate holding hand and the arm are relatively movable with the daisy chain connection.

4. The substrate conveying robot system according to claim 2, wherein
the arm includes a first arm rotatable with a first end as a center of rotation, and a second arm including a first end rotatably connected to a second end of the first arm, rotatable with respect to the first arm, and connected to the substrate holding hand; and
the arm circuit substrate is provided on at least one of the first arm or the second arm.

5. The substrate conveying robot system according to claim 4, wherein the arm circuit substrate includes a first arm circuit substrate provided on the first arm, and a second arm circuit substrate provided on the second arm.

6. The substrate conveying robot system according to claim 5, wherein
the arm sensor includes an analog sensor; and at least one of the first arm circuit substrate or the second arm circuit substrate includes an analog input circuit substrate to which a signal is input from the analog sensor.

7. The substrate conveying robot system according to claim 6, wherein the analog sensor detects other than rotation of a motor provided at a joint of the arm.

8. The substrate conveying robot system according to claim 7, wherein the analog sensor includes at least one of a temperature sensor, an acceleration sensor, or a pressure sensor.

9. The substrate conveying robot system according to claim 5, wherein the second arm circuit substrate includes a digital input/output circuit substrate connected to the plurality of substrate detection sensors to transmit and receive a signal to and from the plurality of substrate detection sensors.

10. The substrate conveying robot system according to claim 9, further comprising:

an electromagnetic valve provided on the second arm to transmit and receive a signal to and from the digital input/output circuit substrate and adjust air sent to a cylinder provided on the substrate holding hand.

11. The substrate conveying robot system according to claim 1, wherein the plurality of substrate detection sensors detects other than rotation of a motor.

12. The substrate conveying robot system according to claim 11, wherein the hand circuit substrate includes a digital input circuit substrate to receive a signal from the plurality of substrate detection sensors.

13. The substrate conveying robot system according to claim 1, wherein the serial communication connection allows mutual information sharing between the robot controller and the hand circuit substrate.

* * * * *